United States Patent
Jiang et al.

(10) Patent No.: US 12,282,995 B2
(45) Date of Patent: Apr. 22, 2025

(54) UNREAL ENGINE-BASED AUTOMATIC LIGHT ARRANGEMENT METHOD AND APPARATUS, DEVICE, AND STORAGE MEDIUM

(71) Applicant: SHENZHEN XUMI YUNTU SPACE TECHNOLOGY CO., LTD., Shenzhen (CN)

(72) Inventors: Zhiyuan Jiang, Shenzhen (CN); Zhenghui Li, Shenzhen (CN); Chunqing Li, Shenzhen (CN)

(73) Assignee: SHENZHEN XUMI YUNTU SPACE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/708,607

(22) PCT Filed: Oct. 18, 2022

(86) PCT No.: PCT/CN2022/126022
§ 371 (c)(1),
(2) Date: May 9, 2024

(87) PCT Pub. No.: WO2023/082959
PCT Pub. Date: May 19, 2023

(65) Prior Publication Data
US 2024/0420415 A1 Dec. 19, 2024

(30) Foreign Application Priority Data
Nov. 10, 2021 (CN) .......................... 202111328102.2

(51) Int. Cl.
*G06T 15/50* (2011.01)
*G06F 30/13* (2020.01)

(52) U.S. Cl.
CPC ............ *G06T 15/506* (2013.01); *G06F 30/13* (2020.01); *G06T 15/50* (2013.01); *G06T 2210/04* (2013.01)

(58) Field of Classification Search
CPC ... G06T 15/506; G06T 2210/04; G06T 15/50; G06F 30/13
See application file for complete search history.

(56) References Cited

U.S. PATENT DOCUMENTS

| | | | |
|---|---|---|---|
| 9,019,269 B1 * | 4/2015 | Pogue | ..................... G06T 17/00 345/419 |
| 2018/0302975 A1 | 10/2018 | Yau | |
| 2021/0104093 A1 * | 4/2021 | Vincent | ................... G06T 19/20 |

FOREIGN PATENT DOCUMENTS

| | | |
|---|---|---|
| CN | 105741194 A | 7/2016 |
| CN | 106504314 A | 3/2017 |

(Continued)

OTHER PUBLICATIONS

Shiratuddin MF, Thabet W. Virtual office walkthrough using a 3D game engine. International Journal of Design Computing. 2002;4(540):1329-7147. (Year: 2002).*

(Continued)

*Primary Examiner* — King Y Poon
*Assistant Examiner* — Vincent Peren
(74) *Attorney, Agent, or Firm* — Bayramoglu Law Offices LLC (57) ABSTRACT

An unreal engine-based automatic light arrangement method includes: acquiring a house type model and basic data imported into an unreal engine, the basic data being data obtained after a house type image file of the house type model is parsed (S101); on the basis of first object data and second object data in the basic data, respectively creating an indoor light source and a light-supplementing light source in a room region of the house type model (S102); creating an (Continued)

outdoor light source for the house type model, and creating a later volume on an outer side of the house type model by using a preset light arrangement rule, such that the house type model is wrapped in the later volume (S103); and adjusting parameters of the later volume, and setting light tracking parameters in the later volume, so as to render light arrangement of the house type model (S104).

9 Claims, 3 Drawing Sheets

(56) References Cited

FOREIGN PATENT DOCUMENTS

| | | |
|---|---|---|
| CN | 107292050 A | 10/2017 |
| CN | 109462926 A | 3/2019 |
| CN | 110276824 A | 9/2019 |
| CN | 111008416 A | 4/2020 |
| CN | 112596713 A | 4/2021 |
| CN | 113139231 A | 7/2021 |
| CN | 114139249 A | 3/2022 |
| CN | 114139250 A | 3/2022 |

OTHER PUBLICATIONS

Kitchens K, Shiratuddin MF. Interactive Home design in a virtual environment. In7th International Conference on Construction Applications of Virtual Reality Oct. 22, 2007 (pp. 22-23). (Year: 2007).*

Natephra W, Motamedi A, Fukuda T, Yabuki N. Integrating building information modeling and virtual reality development engines for building indoor lighting design. Visualization in Engineering. Dec. 2017;5:1-21. (Year: 2017).*

Kaleja P, Kozlovska M. Virtual reality as innovative approach to the interior designing. Selected Scientific Papers-Journal of Civil Engineering. Jun. 2017; 12(1):109-16. (Year: 2017).*

Racz A, Zilizi G. VR aided architecture and interior design. In2018 International Conference on Advances in Computing and Communication Engineering (ICACCE) Jun. 22, 2018 (pp. 11-16). IEEE. (Year: 2018).*

Wong MO, Du J, Zhang ZQ, Liu YQ, Chen SM, Lee SH. An experience-based interactive lighting design approach using BIM and VR: a case study. InIOP Conference Series: Earth and Environmental Science Feb. 1, 2019 (vol. 238, No. 1, p. 012006). IOP Publishing. (Year: 2019).*

Yazgan, Soyhan. "Developing a Virtual Reality Application for Realistic Architectural Visualizations." (2020). (Year: 2020).*

David A. Integrating VR with 3D Modeling for Interactive Architectural Visualization and Photorealistic Simulation: A Direction for Future Smart Construction Design Using a Game Engine. 2nd Intl. Conf. Image Processing and Capsule Networks: ICIPCN 2021 Sep. 9, 2021 (vol. 300, p. 180) Springer Nature. (Year: 2021).*

Scorpio M, Laffi R, Teimoorzadeh A, Ciampi G, Masullo M, Sibilio S. A calibration methodology for light sources aimed at using immersive virtual reality game engine as a tool for lighting design in buildings. Journal of Building Engineering. May 1, 2022;48:103998. (Year: 2022).*

Worawan Natephra, et al., Integrating building information modeling and virtual reality development engines for building indoor lighting design, Visualization in Engineering, 2017, pp. 1-21, vol. 5 No. 19.

* cited by examiner

UNREAL ENGINE-BASED AUTOMATIC LIGHT ARRANGEMENT METHOD AND APPARATUS, DEVICE, AND STORAGE MEDIUM

CROSS REFERENCE TO THE RELATED APPLICATIONS

This application is the national phase entry of International Application No. PCT/CN2022/126022, filed on Oct. 18, 2022, which is based upon and claims priority to Chinese Patent Application No. 202111328102.2, filed on Nov. 10, 2021, the entire contents of which are incorporated herein by reference.

TECHNICAL FIELD

The present disclosure relates to the field of effect picture rendering technologies, and in particular, to the Unreal Engine™ video game engine (unreal engine)-based automatic light arrangement method and apparatus, a device, and a storage medium.

BACKGROUND

A scenario design effect picture means that for a house not really built in a design drawing stage, after a house type model and material reformation are input through three-dimensional design software, an effect after the house is built is rendered and simulated for reference of a user. The scenario design effect picture is inseparable from meticulous design of a scenario by a designer, and reasonable light layout and light effects are quite important for the scenario design.

In the prior art, in a current traditional light arrangement scheme, light is manually arranged through 3DS Max™ three-dimensional design software (3DSmax) or other three-dimensional design software, and then, an effect picture of a scenario is obtained by rendering, such that a degree of manual participation in the whole operation process is high, an adjustment process is over tedious, and the scheme is time-consuming and labor-consuming. Although some software on the market can realize automatic light arrangement of the scenario, problems of a low reality degree of an illumination effect, a long rendering time, or the like, often exist, such that an illumination rendering effect is poor, and a picture generating efficiency is low; moreover, existing automatic light arrangement matching rules are incomplete, an influence of natural light on indoor illumination cannot be fully considered in indoor light arrangement, and the rules cannot be suitable for most scenarios.

SUMMARY

In view of this, embodiments of the present disclosure provide an unreal engine-based automatic light arrangement method and apparatus, a device, and a storage medium, so as to solve problems in the prior art that time and labor are consumed, an illumination rendering effect is poor, a picture generating efficiency is low, and automatic light arrangement matching rules are incomplete and cannot be suitable for most scenarios.

In a first aspect of the embodiments of the present disclosure, there is provided an unreal engine-based automatic light arrangement method, including: acquiring a house type model and basic data imported into an unreal engine, the basic data being data obtained after a house type image file of the house type model is parsed; on the basis of first object data and second object data in the basic data, respectively creating an indoor light source and a light-supplementing light source in a room region of the house type model; creating an outdoor light source for the house type model, and creating a Post Process Volume surrounding the house type model by setting parameters in the unreal engine according to a preset light arrangement rule, such that the house type model is enclosed within the Post Process Volume; and adjusting parameters of the Post Process Volume, and setting light tracking parameters in the Post Process Volume, so as to render light arrangement of the house type model.

In a second aspect of the embodiments of the present disclosure, there is provided an unreal engine-based automatic light arrangement apparatus, including: a data acquiring module configured to acquire a house type model and basic data imported into an unreal engine, the basic data being data obtained after a house type image file of the house type model is parsed; a first creating module configured to, on the basis of first object data and second object data in the basic data, respectively create an indoor light source and a light-supplementing light source in a room region of the house type model; a second creating module configured to create an outdoor light source for the house type model, and creating a Post Process Volume surrounding the house type model by setting parameters in the unreal engine according to a preset light arrangement rule, such that the house type model is enclosed within the Post Process Volume; and a parameter setting module configured to adjust parameters of the Post Process Volume, and set light tracking parameters in the Post Process Volume, so as to render light arrangement of the house type model.

In a third aspect of the embodiments of the present disclosure, there is provided an electronic device, including a memory, a processor and a computer program stored on the memory and runnable on the processor, wherein the processor, when executing the program, implements the steps of the above method.

In a fourth aspect of the embodiments of the present disclosure, there is provided a computer-readable storage medium storing a computer program, wherein the computer program, when executed by a processor, implements the steps of the above method.

At least one of the above technical solutions adopted in the embodiments of the present disclosure can achieve the following beneficial effects.

The house type model and the basic data imported into the unreal engine are acquired, the basic data being data obtained after the house type image file of the house type model is parsed; on the basis of the first object data and the second object data in the basic data, the indoor light source and the light-supplementing light source are created in the room region of the house type model respectively; the outdoor light source is created for the house type model, and the Post Process Volume is created so that the house type model is surrounded by the Post Process Volume by setting parameters in the unreal engine according to the preset light arrangement rule, such that the house type model is enclosed within the Post Process Volume; and the parameters of the Post Process Volume are adjusted, and the light tracking parameters are set in the Post Process Volume, so as to render the light arrangement of the house type model. With the present disclosure, automatic light arrangement can be realized, a degree of manual participation is reduced, the picture generating efficiency is improved, professional and complete automatic light arrangement matching rules are used, the illumination rendering effect is realistic and natural, an influence on indoor illumination of natural light is fully taken into consideration, and the present disclosure is suitable for most scenarios.

BRIEF DESCRIPTION OF THE DRAWINGS

In order to more clearly illustrate the technical solutions in the embodiments of the present disclosure, the accompanying drawings used in the description of the embodiments or the prior art will be briefly introduced below. It is apparent that, the accompanying drawings in the following description are only some embodiments of the present disclosure, and other drawings can be obtained by those of ordinary skill in the art from the provided drawings without creative efforts.

DETAILED DESCRIPTION OF THE EMBODIMENTS

In the following description, for the purpose of illustration instead of limitation, specific details such as a particular system structure and a technology are provided to make the embodiments of the present disclosure understood thoroughly. However, it should be understood by those skilled in the art that the present disclosure can also be implemented in other embodiments without the specific details. In other cases, detailed description of well-known systems, apparatuses, circuits and methods is omitted, so that the present disclosure is described without being impeded by unnecessary details.

As described above, a scenario design effect picture means that for a house not really built in a design drawing stage, after a house type model and material reformation are input through three-dimensional design software, an effect after the house is built is rendered and simulated for reference of a user. The scenario design effect picture is inseparable from meticulous design of a scenario by a designer, and reasonable light layout and light effects are quite important for the scenario design. In the following, taking the scenario of rendering of a prototype room effect picture as an example, a light arrangement manner in rendering of the existing scenario effect picture is described in detail, which may specifically include the following contents.

Currently, in a traditional light arrangement scheme, light is manually arranged through 3DSmax or other three-dimensional design software, and since rendering of the prototype room effect picture serves as a link for controlling a final effect in indoor design, many professional designers are often overwhelmed. After designing an indoor house type, a qualified designer is required to manually arrange light, waits for finishing of the rendering of the effect picture, adjusts an unsatisfactory place, and performs rendering again to generate the picture, and the design can be finished finally by repeating the process. Therefore, the whole operation process has a high degree of manual participation, and the adjustment process is over tedious, so as to generate problems of time and labor consumption.

In addition, when the rendering is performed by using traditional three-dimensional design software, such as a VRay™ renderer based on 3DSmax, a CPU is used to participate in calculation of the renderer, and 2-3 hours are usually taken to render a picture with a resolution of 3K, which makes a whole design modification process inefficient. With continuous advancement of computer and network technologies, a rendering engine with a GPU real-time rendering technology begins to gradually replace the traditional CPU renderer. Taking an unreal engine as an example, the GPU real-time rendering technology (which can be realized by relying on an NVIDIA RTX™ graphics card) is used for the unreal engine, and about 20 pictures with a resolution of 2K can be rendered per second under same rendering quality, such that a production efficiency is greatly improved compared with the VRay™ renderer which requires dozens of minutes to render one picture with a resolution of 2K. A series of GPU indoor rendering tools continuously emerge on the market, and for use of the GPU renderer, light arrangement with natural and real effects is indispensable.

Currently, an indoor automatic light arrangement technology of the GPU real-time renderer is not widely used in the industry, which has a most fundamental reason that the light arrangement effect is not accepted by most designers, and an improvement of an auxiliary design efficiency is not obvious enough. The existing automatic light arrangement scheme based on the GPU real-time renderer still has the following two problems:

1. House type matching limitation. Usage processes of current GPU rendering products on the market include inputting house type information through a website tool, so as to automatically generate house type design and a light arrangement scheme. The light arrangement thereof can only be matched with a suspended ceiling style built in the tool, only one fixed suspended ceiling style is provided, and a shape of an indoor suspended ceiling cannot be freely defined by the designer; that is, self-defined information cannot be input, such that consideration of freedom of indoor design is lacked, the design scheme is limited, practicability is greatly reduced, and the scheme is not a complete automatic prototype room light arrangement scheme at all.

2. Matching rule incompleteness. Influences of natural sky light, sunlight, or the like, of a window on indoor illumination are required to be considered in the complete indoor light arrangement, and simulation of the sky light irradiated from the window to the inside of a room is quite important, and plays an important role in improving a reality degree of an illumination effect. However, in some existing automatic light arrangement schemes, only indoor lamp light sources are considered, the influence of natural light on the indoor illumination is not considered, and therefore, the existing automatic light arrangement schemes are only suitable for indoor scenarios with pure artificial light sources and without windows, such that automatic light arrangement matching rules employed in light arrangement matching algorithms are incomplete, and cannot be well suitable for most scenarios.

In view of the above problems in the prior art, it is desirable to provide an unreal engine-based automatic light arrangement method, which can reduce the degree of manual participation, is not limited by the house type and a design style, fully considers the influence of the natural light on the indoor illumination, makes an illumination rendering effect more real and natural, and generates an automatic light arrangement scheme with professional and complete matching rules. It should be noted that, in the embodiment of the present disclosure, the scenario of the rendering of the indoor design effect picture of the prototype room is described as an example, but the embodiment of the present disclosure is not limited to the application scenario of the light arrangement in the rendering of the effect picture of the virtual prototype room, and automatic light arrangement in other indoor scenarios is also applicable to the embodiment of the present disclosure.

Figure 1:
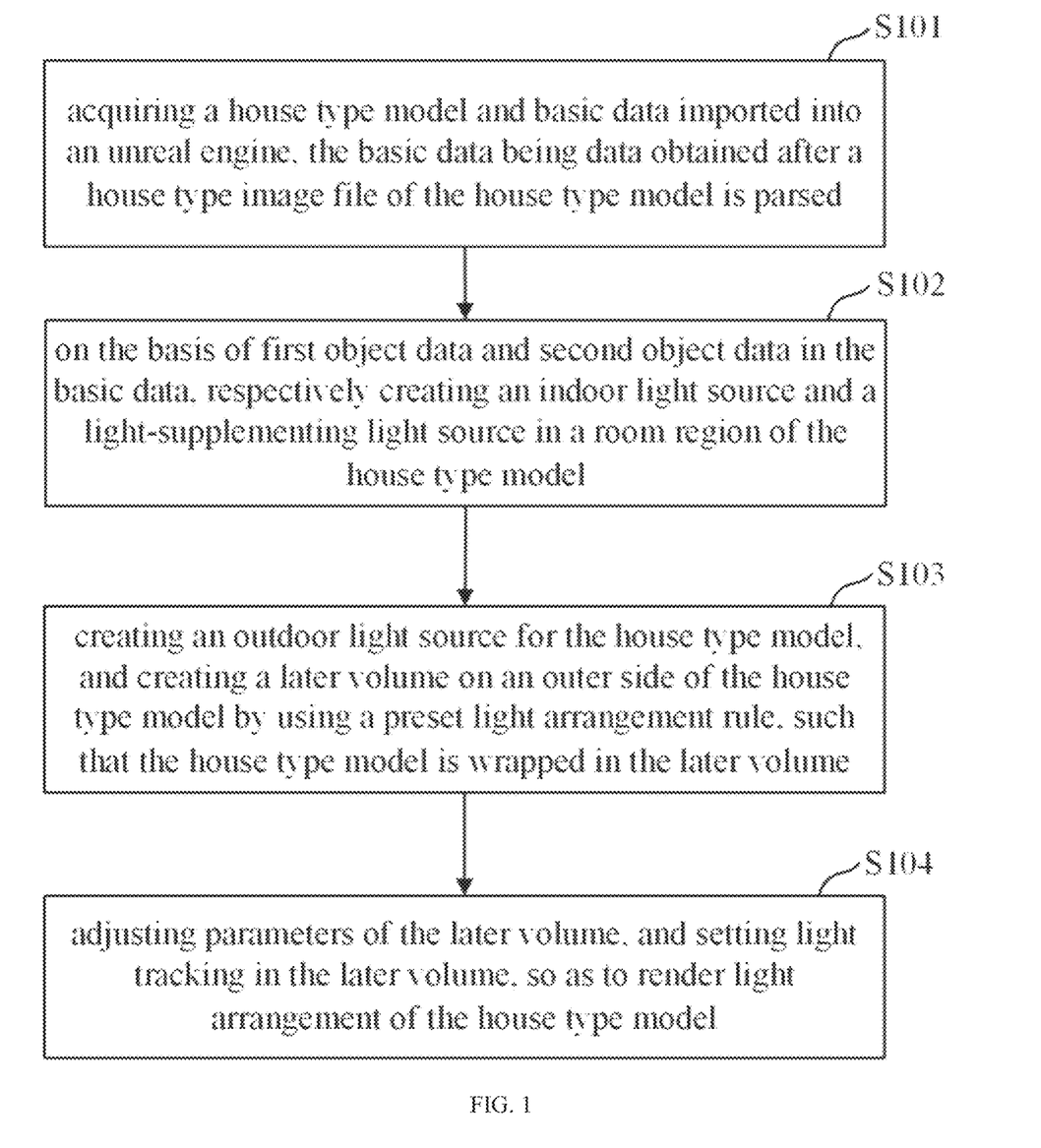
FIG. 1 is a schematic flowchart of an unreal engine-based automatic light arrangement method according to an embodiment of the present disclosure.

FIG. 1 is a schematic flowchart of an unreal engine-based automatic light arrangement method according to an embodiment of the present disclosure. The unreal engine-based automatic light arrangement method of FIG. 1 may be executed by an unreal engine client or server, and as shown in FIG. 1, the unreal engine-based automatic light arrangement method may specifically include:

S101: acquiring a house type model and basic data imported into an unreal engine, the basic data being data obtained after a house type image file of the house type model is parsed;

S102: on the basis of first object data and second object data in the basic data, respectively creating an indoor light source and a light-supplementing light source in a room region of the house type model;

S103: creating an outdoor light source for the house type model, and creating a Post Process Volume surrounding the house type model by setting parameters in the unreal engine according to a preset light arrangement rule, such that the house type model is enclosed within the Post Process Volume; and S104: adjusting parameters of the Post Process Volume, and setting light tracking parameters in the Post Process Volume, so as to render light arrangement of the house type model.

Specifically, in the embodiment of the present disclosure, the basic data is house type related information obtained by identifying housing conditions; that is, the basic data of a house type image is obtained by parsing the house type image file, and the basic data of the house type image includes, but is not limited to, the following types of data: room contours, walls, house types of enclosed regions, geometric polygonal regions, window models, lamp models, or the like.

Here, the room contour refers to an outer contour corresponding to each room in the whole house type image, and the room contour includes the wall; when the wall is marked in the basic data, coordinates of a starting point and an end point of the wall are confirmed in a clockwise direction of a line segment where the wall is located; the house type of the enclosed region refers to a room type corresponding to each room, such as a living room, a dining room, a bedroom, or the like, and is used for matching soft furnishing of a prototype room; the geometric polygonal region is formed by dividing some planar geometric polygonal regions in advance in the house type image, determining positions of vertexes of the planar geometric polygonal regions, and marking coordinates of the vertexes along a clockwise direction of a polygon contour by taking the most northwest vertex of the house type as a starting point; the window model refers to a window model marked in the house type image, such as a French window, a sliding window, or the like, and can be associated with the wall in the region where the window model is located and used for matching hard furnishing of the prototype room; the lamp model refers to a lamp model marked in the house type image, such as a lamp strip, a spot lamp, or the like, and is used for light matching in the prototype room.

Further, in the embodiment of the present disclosure, the house type image file may be a two-dimensional drawing file or a three-dimensional drawing file; for example, the house type image file may be a DWG™ file format (DWG) drawing file or a Revit™ modeling software (Revit) model file. The Revit model file is generated based on a building information modeling (BIM) forward design model, and Revit is a mainstream BIM visualization and modeling tool; BIM refers to a process of building information creation and management in a whole life cycle of planning, designing, construction and operation and maintenance phases of construction projects and facilities, and a three-dimensional, real-time and dynamic model is used in the whole process to cover geometric Information, spatial Information, geographic Information, property Information of various building assemblies and labor and material Information.

Further, in the embodiment of the present disclosure, the unreal engine may be a fourth version unreal engine (UE4 engine), the UE4 engine is a game engine, and in the embodiment of the present disclosure, the UE4 engine is used to process the basic data of the house type model, so as to implement automatic light arrangement of the house type model; certainly, other 3D engines than the UE4 engine can also be used for automatic light arrangement of the house type model, and unreal engines, such as a fifth version unreal engine (UE5), a sixth version unreal engine (UE6), or the like, developed in the future can also be used in conjunction with the embodiment of the present disclosure. Since the process of automatic light arrangement of the house type model is automatically realized based on the UE4 engine in the embodiment of the present disclosure, some algorithms and functions in the UE4 engine are adjusted and improved in the embodiment of the present disclosure, so as to realize the automatic light arrangement.

In the technical solution according to the embodiment of the present disclosure, the house type model and the basic data imported into the unreal engine are acquired, the basic data being data obtained after the house type image file of the house type model is parsed; on the basis of the first object data and the second object data in the basic data, the indoor light source and the light-supplementing light source are created in the room region of the house type model respectively; the outdoor light source is created for the house type model, and the Post Process Volume is created so that the house type model is surrounded by the Post Process volume by setting parameters in the unreal engine according to the preset light arrangement rule, such that the house type model is enclosed within the Post Process Volume; and the parameters of the Post Process Volume are adjusted, and the light tracking parameters are set in the Post Process Volume, so as to render the light arrangement of the house type model. With the present disclosure, automatic light arrangement can be realized, a degree of manual participation is reduced, the picture generating efficiency is improved, professional and complete automatic light arrangement matching rules are used, the illumination rendering effect is realistic and natural, an influence on indoor illumination of natural light is fully taken into consideration, and the present disclosure is suitable for most scenarios.

In some embodiments, before the acquiring a house type model and basic data imported into an unreal engine, the method further includes: acquiring the house type image file corresponding to the house type model, and performing an analysis operation on the house type image file to obtain the basic data corresponding to the house type image file; marking target object data in the basic data to determine the first object data and the second object data in the basic data; the unreal engine being a UE4 engine, and the house type image file being a DWG drawing file or a Revit model file.

Specifically, the house type image file includes some basic data corresponding to the house type model, such as a room contour, a wall, a house type of an enclosed region, a geometric polygonal region, a window model, a lamp model, or the like; the basic data can be obtained by parsing the house type image file through the UE4 engine.

It should be noted that, when the house type image file is a Revit model file, the Revit model file is required to be first converted into an intermediate format model file meeting a requirement of the UE4 engine; that is, the building information modeling file (i.e., the Revit model file) imported into the UE4 engine is converted into a file of a format type readable by the UE4 engine, and in practical applications, the intermediate format model file may be a file of a format with a suffix of Datasmith™ three-dimensional creation platform.

In some embodiments, the first object data includes room contour data and lamp model data, and the creating an indoor light source in a room region of the house type model on the basis of first object data includes: traversing the room contour data and the lamp model data to obtain positions of each room region and each lamp model, and establishing dependency relationships between the room regions and the lamp models according to the positions of the room regions and the lamp models; according to the dependency relationships between the room regions and the lamp models, creating the indoor light source at a position corresponding to the lamp model in each room region, and setting corresponding light source parameters for each indoor light source; the indoor light sources including one or more of the following light sources: a main lamp light source, a spot lamp light source, a lamp strip light source and a kitchen and bathroom lamp light source.

Specifically, the positions of each room region and each lamp model are obtained by traversing the first object data, the positions can be regarded as world positions corresponding to a world coordinate system in the house type model, and the dependency relationship between each room region and the corresponding lamp model is bound according to the positions corresponding to each room region and the corresponding lamp model. A process of binding the dependency relationship between the room region and the lamp model is described in detail below in combination with a specific embodiment, and may specifically include the following contents.

Firstly, a belonging dependency relationship between a single room and a corresponding lamp is found out using a horizontal or vertical intersection point number identification method. Assuming that horizontal projection of the room is a polygon, and the lamp is a single point P, a horizontal leftward half line is made from the point P, and if the point P is located inside the polygon, a number of intersection points of the half line and the polygon has to be an odd number, and if the point P is located outside the polygon, the number of the intersection points has to be an even number (including zero), and sides of the polygon are considered in sequence to find the total number of the intersection points.

In addition, some special cases are considered, and if a side (P1, P2) is considered, and the half line just passes through point P1 or point P2, this intersection point is counted 2 times, which is directly ignored if an ordinate of point P is the same as a smaller ordinate of points (P1, P2). If the half line is horizontal, the half line either has no intersection point or an infinite number of intersection points with the side, which is also directly ignored. If the half line is vertical and an abscissa of point P is smaller than abscissas of (P1, P2), intersection is inevitable. Before the intersection is judged, whether point P is located above the side (P1, P2) is first judged, and if yes, point P is located inside the polygon (that is, the lamp is located inside the room).

Whether a height of the lamp P is between a floor height M and a ceiling height N of the room is judged based on the fact that the lamp P is located in the polygon of the horizontal projection of the room, and if the height of the point P is greater than the floor height M and smaller than the ceiling height N, the lamp P is located in the room, and otherwise, the lamp P is located outside the room.

According to the identification method, all the rooms and all the lamps are traversed in sequence in a circular traversal mode until the dependency relationships (i.e., binding relationships) between all the rooms and all the lamps are found out.

Further, after the dependency relationships between all the room regions and the lamp models are established, according to such dependency relationships (the dependency relationships mainly represent correspondence relationships between positions), the indoor light sources are sequentially created at the positions corresponding to the lamp models within the room regions. Rules for creating the indoor light source and setting the parameters are described in detail below by taking a spot lamp light source and a lamp strip light source as examples, and may specifically include the following contents.

For the creation of the spot lamp light source, when the spot lamp light source is released (that is, the spot lamp light source is created), a world position of a spot lamp is obtained from the basic data, a Z-axis minimum height value of a corresponding boundary of the house type model is calculated and set as a position of the spot lamp light source, and a Y axis of the spot lamp light source is rotated by −90°, such that the spot lamp light source directly faces down.

The light parameters of the spot lamp light source are set: the light source type is a spot lamp light source with a light radius of 270, an internal angle value of 0, an external angle value of 80 and a color temperature of 5,200, an IES description file (provided by a lamp manufacturer) is added, and IES intensity is set to be 0.3. By judging a name of the room where the spot lamp is located, if the name of the room contains keywords of "bathroom" or "kitchen", the IES intensity is set to be 0.5.

For the creation of the lamp strip light source which may also be called a lamp-strip rectangular light source, when the lamp strip light source is released (that is, the lamp strip light source is created), a world position of a lamp strip is obtained from the basic data, and a Z-axis direction and boundary information of a length, a width and a height of a lamp strip model are calculated. A direction of the lamp-strip rectangular light source is calculated, dot multiplication is performed on the Z-axis direction of the lamp strip model and a Y axis of the lamp-strip rectangular light source, and obtained radian is converted into a degree measure unit to be set as a Y-axis rotation value of the lamp-strip rectangular light source.

A width and a height of the lamp-strip rectangular light source are calculated, minimum boundary values are subtracted from maximum boundary values of the lamp strip model, and absolute values of results are taken and set as width and height values of the rectangular light source. The light parameters of the lamp-strip rectangular light source are set: a color temperature is 4,500, IES intensity of the light source is obtained by multiplying the height value of the light source by 0.0002, and global illumination affecting light tracking is turned off.

In some embodiments, the second object data includes a geometric polygonal region corresponding to each room and window model data, and the creating a light-supplementing light source in a room region of the house type model on the basis of the second object data includes: determining a length and a width corresponding to each room according to the geometric polygonal region corresponding to each room, setting a main light position and an auxiliary light position based on the length and the width of each room, creating space light-supplementing light sources at the main light position and the auxiliary light position in each room region, and setting corresponding light source parameters for each space light-supplementing light source; and/or determining a corresponding world position of each window according to the window model data, creating a window light-supplement light source at the world position of each window, and setting corresponding light source parameters for each window light-supplement light source.

Specifically, the light-supplementing light source mainly includes two light sources: the space light-supplementing light source and the window light-supplementing light source, and rules for creation and parameter setting of the two light-supplementing light sources are described in detail below in combination with specific embodiments, and may specifically include the following contents.

For the creation of the space light-supplementing light source, when space supplementing light is released (that is, the space light-supplementing light source is created), since the space supplementing light is composed of main light and auxiliary light, the main light position and the auxiliary light position are required to be set. Before the main light position and the auxiliary light position are set, length and width numerical information of the room is required to be acquired first, values are divided by 200, results are rounded down, and if the values are less than 200, the results are 1, and the results are defined as rough values; for example, if the length and width numerical information of the room is 4.3 meters by 1.8 meters, the calculated rough values are 2 by 1.

When the main light position is set, an intermediate value of the length and the width of the room is obtained (that is, a true center position of the room is determined), the position is set as world positions of an X axis and a Y axis of the main light, a half line is emitted from the point in a positive direction (right above) of a Z axis, and a position of a collision point is set as a world position of the Z axis of the main light.

The light parameters of the main light are set according to the main light position: a type of the main light is a rectangular light source, an attenuation radius is 1,000, a source width and a source height are both 50, a length of a light barrier is 0, a color temperature is 5,200, a high light intensity range is 0, and a surface orientation is a negative direction of the Z axis (right below); a minimum value of the rough values is multiplied by 100 as main light intensity.

The following rules are set: when the rough values of the X axis and the Y axis of the room are both 1, the main light is not started; when either of the X-axis value and the Y-axis value of the room is less than 50, the space supplementing light is not started.

When the auxiliary light position is set, the length and width values of the room are multiplied by 0.6, the obtained results are divided by the rough values to define spacing values, and taking a center point of the room as a center, light having quantities of the rough values is scattered on the X axis and the Y axis at intervals of the spacing values respectively, and set as world positions of the X axis and the Y axis of the auxiliary light, half lines are emitted from the auxiliary light positions in the positive direction (right above) of the Z axis, and positions of collision points are set as world positions of the Z axis of the auxiliary light.

The light parameters of the auxiliary light are set according to the auxiliary light position: a type of the auxiliary light is a rectangular light source, an attenuation radius is 1,000, a source width and a source height are both 50, a length of a light barrier is 0, a color temperature is 5500, a high light intensity range is 0, and a surface orientation is a negative direction of the Z axis (right below); a minimum value of the coarse value is multiplied by 30 as auxiliary light intensity.

For the creation of the window light-supplementing light source, when window supplementing light is released (that is, the window light-supplementing light source is created), a world position of the window is first obtained from the basic data, half lines are emitted from the position in positive and negative directions of a Y axis of the window model for detection respectively, a length of the half lines is 20, whether an end point of the half line is located within the room region to which the window belongs is judged, and a Z axis of the window supplementing light is set to face a side with a result of True.

In some embodiments, a length, a width and a central point position corresponding to each window are obtained from the window model data, a width and a height of the window light-supplementing light source are determined based on the length and the width of each window, and a width coefficient is calculated based on the width and the height of the window light-supplementing light source; depth data of the window light-supplementing light source is determined based on the central point position of each window, and a depth coefficient is calculated based on the depth data of the window light-supplementing light source; and light source intensity corresponding to each window light-supplementing light source is calculated by using the width coefficient and the depth coefficient, and the light source intensity is taken as the light source parameter of the window light-supplementing light source.

Specifically, after the position of the window light-supplementing light source is created, the light parameters of the window light-supplementing light source are required to be set, and at this point, the width coefficient and the depth coefficient of the window supplementing light are required to be used. Rules for setting the light source parameters of the window light-supplementing light source are described in detail below in combination with a specific embodiment, and may specifically include the following contents.

The width coefficient of the window supplementing light is calculated: the length and the width of the window are obtained from the basic data, set as width and height values of the window light-supplementing light source, and deviated by 10 towards the negative direction of the Y axis of the window; the width and the height of the light source are applied to non-clamping mapping relationship functions in the UE4 engine respectively: InRangeA-50, InRangeB-200, OutRangeA-100 and OutRangeB-150, and the calculated result is taken as the width coefficient of the window supplementing light.

The depth coefficient of the window supplementing light is calculated: the central point position of the window model is obtained from the basic data, a half line is emitted towards the interior of the room for detection, the central position of the window model is subtracted from a position of first collision to obtain the depth data, non-clamping mapping relationship functions of the unreal engine are applied: InRangeA-300, InRangeB-1000, OutRangeA-1 and OutRangeB-1.5, and the calculated result is taken as the depth coefficient of the window supplementing light.

The light parameters of the window supplementing light are set: the type of the window supplementing light is a rectangular light source, a color temperature is 7,500, the width coefficient and the depth coefficient are multiplied, and the calculated result is set as the light source intensity of the window supplementing light.

In some embodiments, the creating an outdoor light source for the house type model includes: establishing the outdoor light source for the house type model according to the preset light arrangement rule, and setting corresponding light source parameters for each outdoor light source; the outdoor light source including one or more of the following light source types: directional light sources, sky light sources and sky spheres.

Specifically, for the creation of the outdoor light source, the outdoor light source may also be referred to as ambient light which is composed of light sources, such as parallel light, sky light, sky spheres, or the like. When the outdoor light source is released (that is, the outdoor light source is created), parameters of the above-mentioned ambient light are set, and the specific parameter settings are as follows.

The parallel light is set: intensity is 200, a source angle is 5, a color temperature is 4,000, a high light intensity range is 0, light tracking influencing reflection is forbidden, a rotation parameter X axis is 0°, a Y axis is −20°, and a Z axis is −120°.

The sky light is set: a cube map specified using SLS is used for a light source type, the cube map is an HDR map, an intensity range is 1.5, an RGB color of a light source color is (0.9, 0.94, 1).

The sky sphere is set: the sky sphere is composed of a spherical model and a material, a type of the material is set to be in a non-illumination mode, and a map is multiplied by a constant of 100 and linked to a self-illumination color.

In some embodiments, the adjusting parameters of the Post Process Volume, and setting light tracking parameters in the Post Process Volume includes: setting rendering exposure parameters for the Post Process Volume in the unreal engine, adding a post-processing material for the Post Process Volume by using a material shader, adding a light tracking effect for a scenario by using the Post Process Volume, and setting the light tracking parameters; the light tracking parameters including a light tracking environment light shielding parameter, a light tracking global illumination parameter, a light tracking reflection parameter, and a light tracking refraction parameter.

Specifically, the Post Process Volume is a color matching tool in the UE4 engine, set picture parameters are applied by models in the Post Process Volume, and basic attributes of rendering, such as exposure, light tracking quality, or the like, can be set based on the Post Process Volume. By setting the light tracking parameters, the light tracking quality can be improved. Rules for setting rendering exposure parameters and the light tracking parameters are described in detail below in combination with a specific embodiment, and may specifically include the following contents.

The rendering exposure parameters are set: an exposure method is set to be standard, intensity is 1, a threshold is 1, an exposure metering mode is set to be manual, exposure compensation is 3.75, white balance is set to 6,200, coloring is set to −0.035, and other parameters are defaults.

The light tracking environment light shielding parameter is set: the parameter is set to be enabled, intensity is 1, and a radius is 3; the light tracking global illumination parameter is set: a type is brute force, and maximum rebound is 2; the light tracking reflection parameter is set: maximum rebound is 3, a shadow is disabled, and translucent objects are disabled; the light tracking refraction parameter is set: maximum refracted light is 10, refraction is disabled, and other parameters are defaults.

Further, besides the setting of the above parameters, the post-processing material can be added in the Post Process Volume, a difference of surfaces in different directions in the scenario is calculated by the material shader using a normal of the scenario, and the difference is strengthened to improve an image layering sense. A near scenario and a distant scenario are colored using a depth of the scenario by calculation or distances between all objects in the scenario and a camera, so as to improve a depth sense of a picture.

Figure 2:
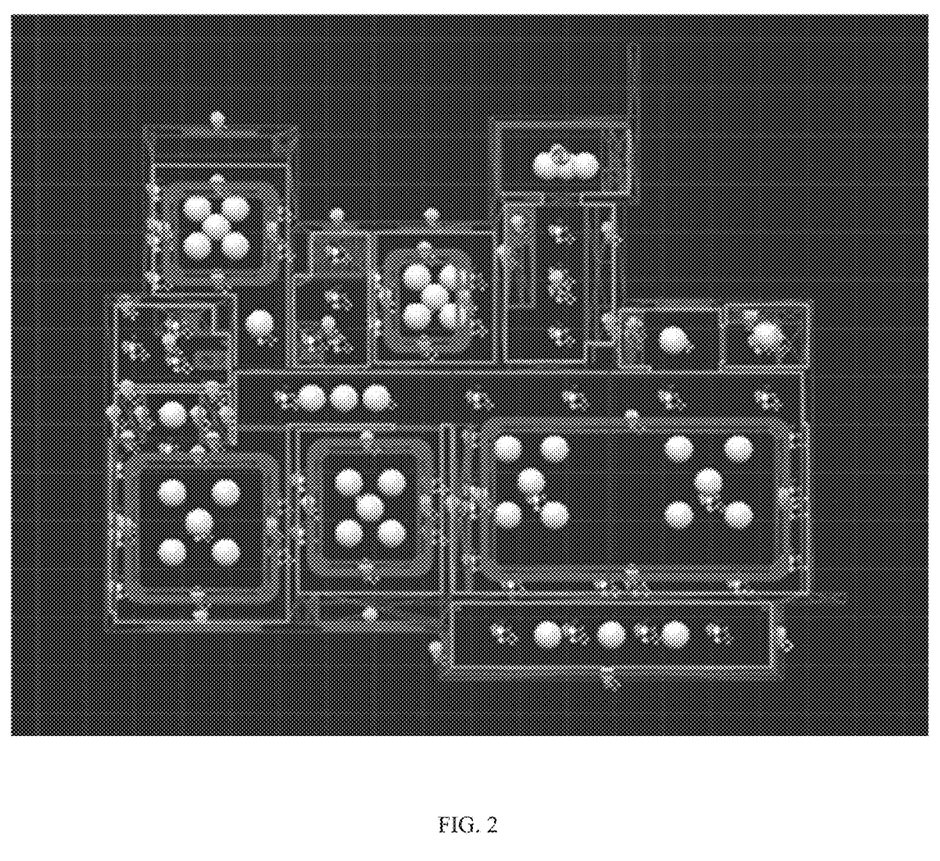
FIG. 2 is a schematic diagram of a house type model after light arrangement in an actual scenario in an embodiment of the present disclosure.

Next, a lamp position obtained by arranging light for the house type model based on the basic data of the house type image in the embodiment of the present disclosure is described with reference to the accompanying drawing, and FIG. 2 is a schematic diagram of the house type model after light arrangement in an actual scenario in the embodiment of the present disclosure. As shown in FIG. 2, the house type model after the light arrangement may specifically include the following contents.

The white origin in FIG. 2 represents the position of the light source created in the house type model with the embodiment of the present disclosure, the house type model is divided into a plurality of geometric polygonal regions, and each geometric polygonal region corresponds to the respective light source; corresponding indoor light sources and space light-supplementing light sources are provided in the regions, such as the bedroom, the living room, the dining room, the kitchen, a toilet, or the like, and in addition, the window light-supplementing light source is provided at the window.

Further, in the embodiment of the present disclosure, the light source is released to the required position by utilizing the preset light arrangement rule, the light intensity and the light quantity can be adjusted in a self-adaptive manner according to a space size of each room in the prototype room using the space light arrangement algorithm of the present disclosure, and the window light-supplementing parameter of the light intensity can be adjusted in a self-adaptive manner according to a size of the window in the prototype room and the depth of the room.

In the technical solution according to the embodiment of the present disclosure, one-key automatic arrangement of the house type light is realized in the unreal engine by calling the automatic light arrangement algorithm, the light can be automatically set for various house types, and the actual use proves that the light setting of the house type can be automatically completed within 5 s, and the automatic light arrangement of the prototype room is really realized; the automatic light arrangement algorithm is not limited by the house type and design styles in the present disclosure, and the professional and complete matching rules are set, such that the exposure parameters are accurate and the light source matching positions are accurate; the light tracking technology is added, the light tracking quality is improved using the parameters, and the influence of the natural light on the indoor illumination is sufficiently considered, such that the final effect of rendering of the effect picture of the prototype room is real and natural, and the solution can be suitable for most scenarios and promote experience of the user during viewing of the effect picture of the prototype room.

An apparatus according to the embodiments of the present disclosure is described below, and may be configured to perform the method according to the embodiments of the present disclosure. For details not disclosed in the embodiments of the apparatus according to the present disclosure, reference is made to the embodiments of the method according to the present disclosure.

Figure 3:
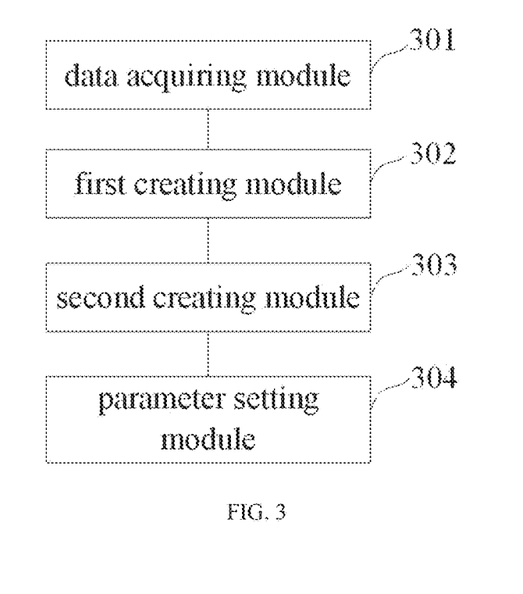
FIG. 3 is a schematic structural diagram of an unreal engine-based automatic light arrangement apparatus according to an embodiment of the present disclosure.

FIG. 3 is a schematic structural diagram of an unreal engine-based automatic light arrangement apparatus according to an embodiment of the present disclosure. As shown in FIG. 3, the unreal engine-based automatic light arrangement apparatus includes:

a data acquiring module 301 configured to acquire a house type model and basic data imported into an unreal engine, the basic data being data obtained after a house type image file of the house type model is parsed;

a first creating module 302 configured to, on the basis of first object data and second object data in the basic data, respectively create an indoor light source and a light-supplementing light source in a room region of the house type model;

a second creating module 303 configured to create an outdoor light source for the house type model, and create a Post Process Volume surrounding the house type model by setting parameters in the unreal engine according to a preset light arrangement rule, such that the house type model is enclosed within the Post Process Volume; and a parameter setting module 304 configured to adjust parameters of the Post Process Volume, and set light tracking parameters in the Post Process Volume, so as to render light arrangement of the house type model.

In some embodiments, before acquiring the house type model and the basic data imported into the unreal engine, the data acquiring module 301 in FIG. 3 is configured to: acquire the house type image file corresponding to the house type model, and perform an analysis operation on the house type image file to obtain the basic data corresponding to the house type image file; mark target object data in the basic data to determine the first object data and the second object data in the basic data; the unreal engine being a UE4 engine, and the house type image file being a DWG drawing file or a Revit model file.

In some embodiments, the first object data includes room contour data and lamp model data, and the first creating module 302 in FIG. 3 is configured to: traverse the room contour data and the lamp model data to obtain positions of each room region and each lamp model, and establish dependency relationships between the room regions and the lamp models according to the positions of the room regions and the lamp models; according to the dependency relationships between the room regions and the lamp models, create the indoor light source at a position corresponding to the lamp model in each room region, and set corresponding light source parameters for each indoor light source; the indoor light sources including one or more of the following light sources: a main lamp light source, a spot lamp light source, a lamp strip light source and a kitchen and bathroom lamp light source.

In some embodiments, the second object data includes a geometric polygonal region corresponding to each room and window model data, and the first creating module 302 in FIG. 3 is configured to: determine a length and a width corresponding to each room according to the geometric polygonal region corresponding to each room, set a main light position and an auxiliary light position based on the length and the width of each room, create space light-supplementing light sources at the main light position and the auxiliary light position in each room region, and set corresponding light source parameters for each space light-supplementing light source; and/or determine a corresponding world position of each window according to the window model data, create a window light-supplement light source at the world position of each window, and set corresponding light source parameters for each window light-supplement light source.

In some embodiments, the first creating module 302 in FIG. 3 is configured to: obtain a length, a width and a central point position corresponding to each window from the window model data, determine a width and a height of the window light-supplementing light source based on the length and the width of each window, and calculate a width coefficient based on the width and the height of the window light-supplementing light source; determine depth data of the window light-supplementing light source based on the central point position of each window, and calculate a depth coefficient based on the depth data of the window light-supplementing light source; and calculate light source intensity corresponding to each window light-supplementing light source by using the width coefficient and the depth coefficient, and take the light source intensity as the light source parameter of the window light-supplementing light source.

In some embodiments, the second creating module 303 in FIG. 3 is configured to: establish the outdoor light source for the house type model according to the preset light arrangement rule, and set corresponding light source parameters for each outdoor light source; the outdoor light source including one or more of the following light source types: directional light sources, sky light sources and sky spheres.

In some embodiments, the parameter setting module 304 in FIG. 3 is configured to: set rendering exposure parameters for the Post Process Volume in the unreal engine, add a post-processing material for the Post Process Volume by using a material shader, add a light tracking effect for a scenario by using the Post Process Volume, and set the light tracking parameters; the light tracking parameters including a light tracking environment light shielding parameter, a light tracking global illumination parameter, a light tracking reflection parameter, and a light tracking refraction parameter.

It should be understood that, the sequence numbers of the steps in the foregoing embodiments do not imply an execution sequence, and the execution sequence of each process should be determined by functions and internal logic of the process, and should not constitute any limitation to the implementation process of the embodiments of the present disclosure.

Figure 4:
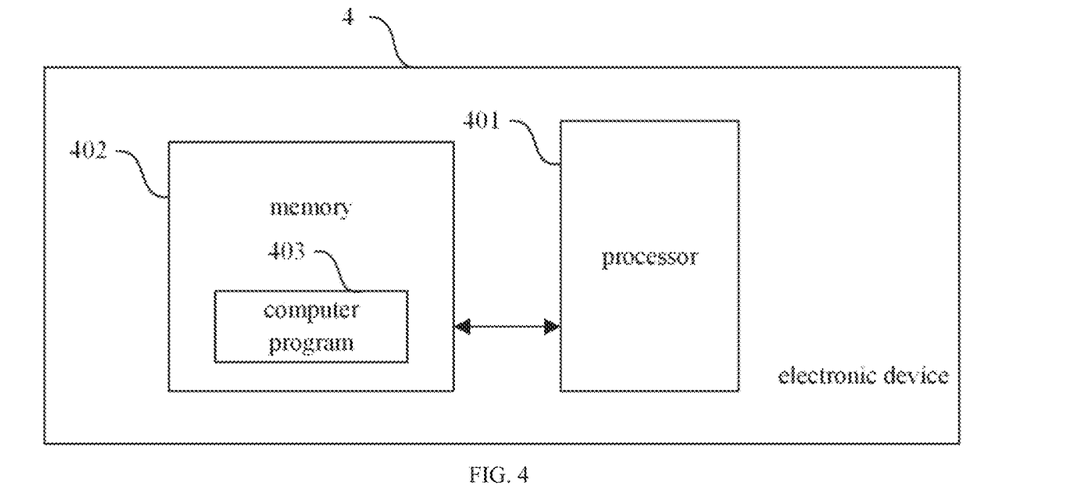
FIG. 4 is a schematic structural diagram of an electronic device according to an embodiment of the present disclosure.

FIG. 4 is a schematic structural diagram of an electronic device 4 according to an embodiment of the present disclosure. As shown in FIG. 4, the electronic device 4 according to the present embodiment includes: a processor 401, a memory 402, and a computer program 403 stored in the memory 402 and executable on the processor 401. The steps in the various method embodiments described above are implemented when the processor 401 executes the computer program 403. Alternatively, the processor 401 achieves the functions of each module/unit in each apparatus embodiment described above when executing the computer program 403.

Exemplarily, the computer program 403 may be partitioned into one or more modules/units, which are stored in the memory 402 and executed by the processor 401 to complete the present disclosure. One or more of the modules/units may be a series of computer program instruction segments capable of performing specific functions, the instruction segments describing the execution of the computer program 403 in the electronic device 4.

The electronic device 4 may be a desktop computer, a notebook, a palm computer, a cloud server or another electronic device. The electronic device 4 may include, but is not limited to, the processor 401 and the memory 402. Those skilled in the art may understand that a structure shown in FIG. 4 is only an example of the electronic device 4 and does not limit the electronic device 4, which may include more or fewer components than those shown in the drawings, or some components may be combined, or a different component deployment may be used. For example, the electronic device may further include an input/output device, a network access device, a bus, or the like.

The processor 401 may be a Central Processing Unit (CPU), or other general-purpose processors, Digital Signal Processors (DSP), Application Specific Integrated Circuits (ASIC), Field-Programmable Gate Arrays (FPGA) or other programmable logic devices, discrete gates or transistor logic devices, discrete hardware components, etc. The general-purpose processor may be a microprocessor or the processor may be any general processor, or the like.

The memory 402 may be an internal storage unit of the electronic device 4, for example, a hard disk or memory of the electronic device 4. The memory 402 may also be an external storage device of the electronic device 4, such as a plug-in hard disk, a Smart Media Card (SMC), a Secure Digital (SD) Card, a Flash Card, or the like, configured on the electronic device 4. Further, the memory 402 may also include both the internal storage unit and the external storage device of the electronic device 4. The memory 402 is configured to store the computer program and other programs and data required by the electronic device. The memory 402 may be further configured to temporarily store data which has been or will be outputted.

It may be clearly understood by those skilled in the art that, for convenient and brief description, division of the above functional units and modules is used as an example for illustration. In practical application, the above functions can be allocated to different functional units and modules and implemented as required; that is, an internal structure of the apparatus is divided into different functional units or modules to accomplish all or some of the functions described above. The functional units or modules in the embodiments may be integrated into one processing unit, or each of the units may exist alone physically, or two or more units are integrated into one unit, and the integrated unit may be implemented in a form of hardware, or may also be implemented in a form of a software functional unit. In addition, specific names of all the functional units or modules are merely for facilitating the differentiation, but are not intended to limit the protection scope of this application. For a specific working process of the units or modules in the above system, reference may be made to the corresponding process in the foregoing method embodiments, which is not repeated herein.

In the above embodiments, the description of each embodiment has its own emphasis. For a part not described in detail in one embodiment, reference may be made to relevant description of other embodiments.

Those of ordinary skill in the art would appreciate that the units and algorithmic steps of the examples described in combination with the embodiments disclosed herein can be implemented by electronic hardware or a combination of computer software and electronic hardware. Whether these functions are performed by hardware or software depends on a specific application and design constraints of the technical solution. Technical professionals may achieve the described functions in different methods for each particular application, but such implementation should not be considered beyond the scope of the present disclosure.

In the embodiments according to the present disclosure, it is to be understood that the disclosed apparatus/computer device and method can be implemented in other ways. For example, the embodiment of the apparatus/computer device described above is merely schematic. For example, the division of the modules or units is merely logical function division, and there may be other division manners in an actual implementation. For example, a plurality of units or components may be combined or integrated into another system, or some features may be ignored or not performed. In addition, the displayed or discussed mutual coupling or direct coupling or communication connection may be implemented by using some interfaces. The indirect coupling or communication connection between apparatuses or units may be implemented in an electric form, a mechanical form, or other forms.

The units described as separate parts may or may not be physically separate, and parts displayed as units may or may not be physical units, may be located at one position, or may be distributed on a plurality of network units. Some or all of the units may be selected according to actual needs to achieve the objectives of the solutions of the embodiments.

In addition, the functional units in the embodiments of the present disclosure may be integrated into one processing unit, or each of the units may exist alone physically, or two or more units are integrated into one unit. The integrated unit may be implemented in a form of hardware or in a form of a software functional unit.

The integrated module/unit may be stored in a computer-readable storage medium when implemented in the form of the software functional unit and sold or used as a separate product. Based on such understanding, all or some of the processes in the method according to the above embodiments may be realized in the present disclosure, or completed by the computer program instructing related hardware, the computer program may be stored in the computer-readable storage medium, and when the computer program is executed by the processor, the steps of the above method embodiments may be realized. The computer program may include a computer program code, which may be in a form of a source code, an object code or an executable file or in some intermediate forms. The computer-readable medium may include any entity or apparatus capable of carrying the computer program code, a recording medium, a USB flash drive, a removable hard disk, a magnetic disk, an optical disk, a computer memory, a Read-Only Memory (ROM), a Random Access Memory (RAM), an electrical carrier signal, a telecommunication signal, a software distribution medium, and so on. It should be noted that content included in the computer-readable medium may be appropriately increased or decreased according to requirements of legislation and patent practice in a jurisdiction, for example, in some jurisdictions, according to legislation and patent practice, the computer-readable medium does not include the electrical carrier signal and the telecommunication signal.

The above embodiments are merely intended to describe the technical solutions of the present disclosure, but not to limit the present disclosure. Although the present disclosure is described in detail with reference to the foregoing embodiments, those of ordinary skill in the art should understand that they may still make modifications to the technical solutions described in the foregoing embodiments or make equivalent replacements to some technical features thereof. Such modifications or replacements do not cause the essence of the corresponding technical solutions to depart from the spirit and scope of the technical solutions of the embodiments of the present disclosure, and should be included in the protection scope of the present disclosure.

What is claimed is:

1. An Unreal Engine™ video game engine (unreal engine)-based automatic light arrangement method, comprising:
   acquiring a house type model and basic data imported into the unreal engine, wherein the basic data is data obtained after a house type image file of the house type model is parsed;
   on the basis of first object data and second object data in the basic data, respectively creating an indoor light source and a light-supplementing light source in a room region of the house type model;
   creating an outdoor light source for the house type model, and creating a Post Process Volume surrounding the house type model by setting parameters in the unreal engine according to a preset light arrangement rule, such that the house type model is enclosed within Post Process Volume; and
   adjusting parameters of the Post Process Volume, and setting light tracking parameters in the Post Process Volume, so as to render light arrangement of the house type model,
   wherein the first object data comprises room contour data and lamp model data, and the creating an indoor light source in a room region of the house type model on the basis of first object data comprises:
   traversing the room contour data and the lamp model data to obtain positions of each room region and each lamp model, and establishing dependency relationships between the room regions and the lamp models according to the positions of the room regions and the lamp models; and
   according to the dependency relationships between the room regions and the lamp models, creating the indoor light source at a position corresponding to the lamp model in each room region, and setting corresponding light source parameters for each indoor light source;
   wherein the indoor light sources comprise one or more of the following light sources: a main lamp light source, a spot lamp light source, a lamp strip light source and a kitchen and bathroom lamp light source.

2. The unreal engine-based automatic light arrangement method according to claim 1, before the acquiring a house type model and basic data imported into an unreal engine, further comprising:
   acquiring the house type image file corresponding to the house type model, and performing an analysis operation on the house type image file to obtain the basic data corresponding to the house type image file; and
   marking target object data in the basic data to determine the first object data and the second object data in the basic data;
   wherein the unreal engine is a fourth version unreal engine (UE4 engine), and the house type image file is a DWG™ file format drawing file or a Revit™ modeling software model file.

3. The unreal engine-based automatic light arrangement method according to claim 1, wherein the creating an outdoor light source for the house type model comprises:
   establishing the outdoor light source for the house type model according to the preset light arrangement rule, and setting corresponding light source parameters for each outdoor light source; wherein the outdoor light source comprises one or more of the following light source types: directional light sources, sky light sources and sky spheres.

4. The unreal engine-based automatic light arrangement method according to claim 1, wherein the adjusting parameters of the Post Process Volume, and setting light tracking parameters in the Post Process Volume comprises:
   setting rendering exposure parameters for the Post Process Volume in the unreal engine, adding a post-processing material for the Post Process Volume by using a material shader, adding a light tracking effect for a scenario by using the Post Process Volume, and setting the light tracking parameters;
   wherein the light tracking parameters comprise a light tracking environment light shielding parameter, a light tracking global illumination parameter, a light tracking reflection parameter, and a light tracking refraction parameter.

5. An electronic device, comprising a memory, a processor and a computer program stored on the memory and runnable on the processor, wherein the processor, when executing the computer program, implements the unreal engine-based automatic light arrangement method according to claim 1.

6. A non-transitory computer-readable storage medium storing a computer program, wherein the computer program, when executed by a processor, implements the unreal engine-based automatic light arrangement method according to claim 1.

7. An Unreal Engine™ video game engine (unreal engine)-based automatic light arrangement method, comprising:
   acquiring a house type model and basic data imported into the unreal engine, wherein the basic data is data obtained after a house type image file of the house type model is parsed;
   on the basis of first object data and second object data in the basic data, respectively creating an indoor light source and a light-supplementing light source in a room region of the house type model;
   creating an outdoor light source for the house type model, and creating a Post Process Volume surrounding the house type model by setting parameters in the unreal engine according to a preset light arrangement rule, such that the house type model is enclosed within the Post Process Volume; and
   adjusting parameters of the Post Process Volume, and setting light tracking parameters in the Post Process Volume, so as to render light arrangement of the house type model,
   wherein the second object data comprises a geometric polygonal region corresponding to each room and window model data, and the creating a light-supplementing light source in a room region of the house type model on the basis of the second object data comprises:

determining a length and a width corresponding to each room according to the geometric polygonal region corresponding to each room, setting a main light position and an auxiliary light position based on the length and the width of each room, creating space light-supplementing light sources at the main light position and the auxiliary light position in each room region, and setting corresponding light source parameters for each space light-supplementing light source; and/or determining a corresponding world position of each window according to the window model data, creating a window light-supplement light source at the world position of each window, and setting corresponding light source parameters for each window light-supplement light source.

8. The unreal engine-based automatic light arrangement method according to claim 7, further comprising:

obtaining a length, a width and a central point position corresponding to each window from the window model data, determining a width and a height of the window light-supplementing light source based on the length and the width of each window, and calculating a width coefficient based on the width and the height of the window light-supplementing light source;

determining depth data of the window light-supplementing light source based on the central point position of each window, and calculating a depth coefficient based on the depth data of the window light-supplementing light source; and calculating a light source intensity corresponding to each window light-supplementing light source by using the width coefficient and the depth coefficient, and taking the light source intensity as the light source parameter of the window light-supplementing light source.

9. An Unreal Engine™ video game engine (unreal engine)-based automatic light arrangement apparatus, comprising:

a data acquiring module configured to acquire a house type model and basic data imported into the unreal engine, wherein the basic data is data obtained after a house type image file of the house type model is parsed;

a first creating module configured to, on the basis of first object data and second object data in the basic data, respectively create an indoor light source and a light-supplementing light source in a room region of the house type model;

a second creating module configured to create an outdoor light source for the house type model, and create a Post Process Volume surrounding the house type model by setting parameters in the unreal engine according to a preset light arrangement rule, such that the house type model is enclosed within in the Post Process Volume; and a parameter setting module configured to adjust parameters of the Post Process Volume, and set light tracking parameters in the Post Process Volume, so as to render light arrangement of the house type model, wherein the first object data comprises room contour data and lamp model data, wherein the first creating module is configured to traverse the room contour data and the lamp model data to obtain positions of each room region and each lamp model, to establish dependency relationships between the room regions and the lamp models according to the positions of the room regions and the lamp models, to create, according to the dependency relationships between the room regions and the lamp models, the indoor light source at a position corresponding to the lamp model in each room region, and to set corresponding light source parameters for each indoor light source;

wherein the indoor light sources comprise one or more of the following light sources: a main lamp light source, a spot lamp light source, a lamp strip light source and a kitchen and bathroom lamp light source.

\* \* \* \* \*